United States Patent
Steigerwald et al.

(10) Patent No.: US 6,949,744 B2
(45) Date of Patent: Sep. 27, 2005

(54) ELECTRON MICROSCOPY SYSTEM, ELECTRON MICROSCOPY METHOD AND FOCUSING SYSTEM FOR CHARGED PARTICLES

(75) Inventors: Michael Steigerwald, Aalen (DE); Erik Essers, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 0 days.

(21) Appl. No.: 10/825,240

(22) Filed: Apr. 16, 2004

(65) Prior Publication Data

US 2005/0006582 A1 Jan. 13, 2005

(30) Foreign Application Priority Data

Apr. 17, 2003 (DE) .......................................... 103 17 894

(51) Int. Cl.[7] .......................... G01N 23/00; H05H 7/06; H01J 25/00
(52) U.S. Cl. ....................... 250/310; 250/305; 250/306; 250/307; 250/396 R; 250/396 ML; 250/397; 250/399; 250/492.3
(58) Field of Search .......................... 250/310, 396 R, 250/305–307, 397, 399, 396 ML, 492.3

(56) References Cited

U.S. PATENT DOCUMENTS

| | | | |
|---|---|---|---|
| 2,354,287 A | 7/1944 | Zworykin et al. | |
| 2,661,427 A | 12/1953 | Page | |
| 4,330,707 A | 5/1982 | Manzke | |

(Continued)

FOREIGN PATENT DOCUMENTS

| | | |
|---|---|---|
| DE | 29 22 325 A1 | 12/1980 |
| DE | 36 38 682 A1 | 5/1988 |
| DE | 37 03 028 A1 | 9/1988 |
| DE | 38 39 707 A1 | 5/1990 |
| DE | 196 05 855 A1 | 8/1997 |
| DE | 102 17 507 A1 | 11/2003 |
| EP | 0 180 723 A1 | 5/1986 |

(Continued)

OTHER PUBLICATIONS

Laurence C. Oldfield, "Computer Design of High Frequency Electron–Optical System", Image Processing and Computer–Aided Design, Electron Optics, P.W. Hawkes, Ed., Academic Press, London, 1973, pp. 370–399.

Jin–Ichi Matsuda, et al., "Calculations of the Aberration Properties of the $TM_{010}$ Mode RF–fields Electron Lens", No. 1236, 1975.

G. Schönhense, et al., "Chromatic and Spherical Aberration Correction Using Time–Dependent Acceleration and Lens Fields", Microsc. Microanal. 9 (Suppl. 3), 2003, pp. 34–35, DOI 10.1017/S1431927603011188.

*Primary Examiner*—John R. Lee
*Assistant Examiner*—Bernard E. Souw
(74) *Attorney, Agent, or Firm*—Jones Day

(57) ABSTRACT

An electron microscopy system and an electron microscopy method for detection of time dependencies of secondary electrons generated by primary electrons is provided, in which the primary electron pulses are directed onto a sample surface and electrons emanating from the sample surface are detected, time resolved. To this end the system comprises in particular a cavity resonator. A cavity resonator can also be used to reduce aberrations of focusing lenses.

42 Claims, 9 Drawing Sheets

U.S. PATENT DOCUMENTS

| | | | |
|---|---|---|---|
| 4,464,571 A | | 8/1984 | Plies |
| 4,626,690 A | * | 12/1986 | Todokoro et al. ....... 250/396 R |
| 4,713,543 A | | 12/1987 | Feuerbaum et al. |
| 4,728,790 A | | 3/1988 | Plies |
| 4,780,682 A | * | 10/1988 | Politzer ...................... 315/507 |
| 4,785,176 A | | 11/1988 | Frosien et al. |
| 4,812,651 A | | 3/1989 | Feuerbaum et al. |
| 4,831,266 A | | 5/1989 | Frosien et al. |
| 4,896,036 A | | 1/1990 | Rose et al. |
| 4,926,054 A | | 5/1990 | Frosien |
| 5,041,724 A | | 8/1991 | Feuerbaum et al. |
| 5,061,856 A | | 10/1991 | Frosien et al. |
| 5,146,090 A | | 9/1992 | Plies |
| 5,185,571 A | * | 2/1993 | Brust ......................... 324/751 |
| 5,677,530 A | | 10/1997 | Sato et al. |
| 5,686,802 A | * | 11/1997 | Ikegami ...................... 315/500 |
| 5,780,859 A | | 7/1998 | Feuerbaum et al. |
| 5,808,309 A | | 9/1998 | Spehr et al. |
| 5,847,399 A | | 12/1998 | Schmitt et al. |
| 5,895,917 A | | 4/1999 | Ueda et al. |
| 6,037,589 A | | 3/2000 | Yonezawa et al. |
| 6,051,838 A | | 4/2000 | Frosien et al. |
| 6,104,034 A | | 8/2000 | Frosien et al. |
| 6,107,633 A | | 8/2000 | Frosien et al. |
| 6,232,601 B1 | | 5/2001 | Schmitt et al. |
| 6,310,341 B1 | * | 10/2001 | Todokoro et al. ........... 250/305 |
| 6,737,647 B2 | * | 5/2004 | Schonhense et al. ........ 250/310 |
| 2002/0130262 A1 | * | 9/2002 | Nakasuji et al. ............ 250/311 |
| 2004/0000646 A1 | * | 1/2004 | Schonhense et al. ........ 250/397 |

FOREIGN PATENT DOCUMENTS

| | | |
|---|---|---|
| EP | 0 205 184 A2 | 12/1986 |
| EP | 0 242 602 A2 | 10/1987 |
| EP | 0 274 622 A1 | 7/1988 |
| EP | 0 281 743 A2 | 9/1988 |
| EP | 0 333 018 A2 | 9/1989 |
| EP | 0 428 906 A2 | 5/1991 |
| EP | 0 461 442 A2 | 12/1991 |
| EP | 0 762 468 A1 | 3/1997 |
| EP | 0 790 634 A1 | 8/1997 |
| EP | 0 821 392 A1 | 1/1998 |
| EP | 0 821 393 A1 | 1/1998 |
| EP | 0 834 896 A1 | 4/1998 |
| EP | 0 834 335 A1 | 5/1998 |
| EP | 0 843 335 A1 | 5/1998 |
| EP | 0 910 108 A1 | 4/1999 |
| EP | 0 910 109 A1 | 4/1999 |
| EP | 0 952 606 A1 | 10/1999 |
| JP | 02-213037 A | 8/1990 |
| SU | 997135 A1 | 2/1983 |

* cited by examiner

ELECTRON MICROSCOPY SYSTEM, ELECTRON MICROSCOPY METHOD AND FOCUSING SYSTEM FOR CHARGED PARTICLES This application claims priority to German Patent Application No. 103 17 894.5 filed in Germany on Apr. 17, 2003, the entire contents of which are incorporated herein by reference.

BACKGROUND OF THE INVENTION

1. Field of the Invention

The invention relates to a focusing system for charged particles, an electron microscopy system and an electron microscopy method.

2. Brief-Description of Related Art

In a conventional electron microscopy system and method, a primary electron beam is directed onto a sample to be inspected. The electrons impinging on the sample react with the sample and cause emanance of electrons from the sample. These electrons emanating from the sample are then detected. According to the characteristics of the sample at the position at which the primary electron beam impinges thereupon, more or less electrons will, at constant primary electron beam intensity, emanate from the sample. From an examination of the intensity of the electrons emanating from the sample in dependence of the location, at which the primary electron beam impinges on the sample, structural information regarding the sample or electron microscopic images, respectively, may be obtained.

To this end, the electrons emanating from the sample are, for example, formed to an electron beam by an objective lens of the electron microscopy system. A portion of this beam or the full beam is supplied to an electron detector. In contrast to the primary electron beam, this beam formed of electrons emanating from the sample will be termed secondary electron beam in the context of this application.

The electrons emanating from the sample are generated by the electrons of the primary electron beam through different physical effects. These effects comprise:

Generation of back scattering electrons, which according to a common definition have an energy of more than 50 eV and are abbreviated BSE;

Generation of electrons which according to the common definition have an energy of less than 50 eV and are termed secondary electrons in the narrower sense. These are again discriminated into secondary electrons abbreviated SE1, which are generated near the surface of the sample by an impinging primary electron, and secondary electrons abbreviated SE2 which are for example generated by back scattering electrons emanating from the sample near the sample's surface;

Generation of electrons of the primary electron beam, which do not quite reach the surface of the sample but are reflected just before the sample's surface due to a charging of the sample and which are commonly referred to as mirror electrons; and Generation of transmission electrons, which are primary electrons traversing the sample and scattered primary electrons and secondary electrons emanating from the sample in a direction of the primary electron beam.

Independently from the generating mechanism of the electrons emanating from the sample, these are termed secondary electrons in the context of this application, as long as their generation is caused by one or more impinging primary electrons.

For example from U.S. Pat. No. 4,464,571, an electron microscopy system is known, in which the electrons emanating from the sample are examined with respect to their kinetic energy, so as to draw conclusions concerning the generating mechanism of the electrons emanating from the sample. By energy-selectively examining intensities of the secondary electrons having energies within predetermined intervals, it is possible to obtain additional structural information about the examined sample.

With this background, it is an object of the present invention to suggest an electron microscopy system and an electron microscopy method, with which it is possible to obtain structural information in an alternative manner.

Furthermore, an electron microscopy system comprises a focusing system for the charged particles, namely the primary electrons. The focusing system usually comprises a magnetic focusing lens or an electrostatic focusing lens or a combination from a magnetic focusing lens and an electrostatic focusing lens, to focus the charged particles in a focus as small as possible. However, the focusing lens typically has a so-called spherical aberration, such that charged particles traversing the lens in radially outer regions are deflected too much compared with charged particles traversing the lens in radially inner regions, so that the charged particles are not focused in an ideal point, but in a radially extending disk. Further, such focusing lens also has a chromatic aberration, which is caused by particles having a smaller kinetic energy being deflected more than particles with a higher kinetic energy. When focusing charged particles having kinetic energies in an energy band of a non-negligible width, the particles also cannot be focused in an ideal point but only in a radially extending disk.

In the article "Computer Design of High Frequency Electron-Optical Systems" by Laurence C. Oldfield in "Image Processing and Computer-aided Design", Electron Optics, P. W. Hawkes (ed.), Academic Press, London, pages 370–399, 1973, it is proposed to integrate into a focusing lens a cavity resonator in order to compensate for aberrations of the focusing lens. However, it has turned out that this proposal is insufficient for providing a satisfactory compensation of the aberrations of the focusing lens.

SUMMARY OF THE INVENTION

The present invention has been accomplished taking the above problems into consideration.

Thus, it is an object of the present invention to provide an improved focusing system and method for charged particles. It is a further object to provide an improved electron microscopy system using such focusing system.

Further it is an object of the invention to provide an electron microscopy system and method allowing to obtain structural information relating to a sample in an alternative manner.

According to a first aspect of the present invention, a focusing system for charged particles comprises a pulsed source for providing a pulsed beam of charged particles, and a beam guide system for guiding the charged particles of the pulsed beam towards an object plane, wherein the beam guide system comprises a focusing lens assembly for focusing the charged particles of the pulsed beam in the object plane, and a cavity resonator arranged in a beam path of the pulsed beam upstream of the focusing lens assembly.

Thereby, it is possible to adapt the fields provided by the cavity resonator independently of the fields provided by the focusing lens arrangement and to thereby shape or influence a phase space distribution of particles in a particle pulse before entry of the charged particles into the focusing lens arrangement in such a way that an aberration of the focusing lens arrangement with respect to fine focusing of the charged particles is at least partially compensated for. In particular, a drift space provided between the focusing lens arrangement and the cavity resonator in which fields of the focusing lens arrangement and fields of the cavity resonator do not substantially overlap may enable to amplify even a relatively small action of the fields of the cavity resonator on the particle pulse during the drift of the particle pulse through the drift space such that eventually a satisfactory compensation of the aberrations of the focusing lens arrangement is achieved.

A high frequency generator is provided for supplying the cavity resonator with high frequency power wherein the cavity resonator and the high frequency generator are preferably configured such that in the interior of the cavity resonator an electromagnetic alternating field may be generated which has a main component of its electrical field oriented along a direction of the beam path of the charged particles in the interior of the cavity resonator. Thereby, the cavity resonator may accelerate or decelerate the charged particles.

When the cavity resonator accelerates the charged particles, a phase relation between the pulsed source and a temporal field evolution in the high frequency generator is set such that a strength of the main component of the electrical field is increasing when the charged particles are within the cavity. This is based on the understanding that charged particles with a comparatively higher kinetic energy are leading the pulse and therefore enter earlier into the cavity resonator and are accelerated less due to the increasing field strength than the following charged particles with lower kinetic energy which are then accelerated more. Thereby, the cavity resonator acts towards reducing an energy band width of the charged particles of the pulse whereby the effects of the chromatic aberration of the focusing lens arrangement are reduced.

When, on the other hand, the field of the cavity resonator decelerates the charged particles, the phase relation is preferably set such that the strength of the main component of the electrical field decreases when the pulse traverses the cavity.

In the case of a field of the high frequency generator acting in an accelerating way on the charged particles, it is furthermore preferable that the strength of the acceleration field increases with an increasing radial distance from a center of the interior of the cavity resonator traversed by the pulsed beam. The underlying rationale is that particles of the pulse traversing radially farther outwards are accelerated more than particles of the pulse transiting radially farther inwards. The particles transiting radially farther outwards will thereafter enter into the focusing lens arrangement again radially farther outwards where, due to their relatively higher kinetic energy, a deflection angle of the focusing lens arrangement with respect to the focusing of the particles is reduced, whereby a spherical aberration of the focusing lens arrangement is at least partially compensable.

If on the other hand the cavity resonator acts decelerating on the charged particles a geometry of the cavity resonator and a high frequency generator are vice versa adapted to one another such that the decelerating action of the field decreases with an increasing radial distance from a center of the interior traversed by the pulsed beam.

According to a second aspect of the invention, an electron microscopy system comprises a focusing system of the type described above.

According to a third aspect of the invention, an electron microscopy system is provided in which the primary electrons are directed towards the sample as at least one pulse short in time, and a time dependence of electrons emanating from the sample is examined. This is based on the understanding that with the different physical effects of generation of electrons emanating from the sample there are associated different times between the impinging of the pulse of primary electrons and the emission of the secondary electrons caused by the pulse of primary electrons. Therefore, an examination of the time dependence of intensities of electrons emanating from the sample may yield additional structure information concerning the examined sample.

According to a further aspect, the invention provides an electron microscopy system which comprises a cavity resonator in its beam path. It has turned out that the arrangement of such a cavity resonator in the beam path of the primary electron beam and/or in the beam path of the secondary electron beam allows for new configurations and modes of operation of electron microscopy systems. In particular, the primary electron beam and/or secondary electron beam can be influenced very rapidly by the cavity resonator arranged in the beam path, which allows for entirely new modes of operation of the electron microscopy system and thereby for entirely new examining mechanisms for electron microscopy samples.

According to an exemplary embodiment, the cavity resonator is arranged in the beam path of the secondary electron beam and an at least one-dimensionally position sensitive detector is arranged in the beam path of the secondary electron beam behind the cavity resonator. Thereby, it is possible to observe a time dependent intensity evolution in the secondary electron beam with high temporal resolution.

According to another exemplary embodiment, the cavity resonator is arranged in the beam path of the primary electron beam. The beam stop with an aperture is arranged in the beam path of the primary electron beam downstream of the cavity resonator. Thereby it is possible to generate a primary electron beam having a time dependent intensity pattern with a high time resolution. It is in particular possible to very rapidly switch on and off the primary electron beam and furthermore to shape particularly short primary electron beam pulses or bunches of primary electrons. The cavity resonator is preferably supplied by a high frequency generator in such a way that an electromagnetic alternating field may be generated in an interior of the cavity resonator which is traversed by the beam path, wherein the electromagnetic alternating field has a main component of its magnetic field which is transversely oriented relative to a direction of the beam path in the interior of the cavity resonator.

According to an embodiment of the invention, the electron microscopy system for examining a sample arranged in an object plane of the electron microscopy system comprises preferably: a pulsed electron beam source; an electron microscopy objective lens which is adapted to direct the pulsed primary electron beam generated by the electron beam source onto the sample, and to shape electrons emanating from the sample to a secondary electron beam; and an electron detection system for detection of electrons of the secondary electron beam wherein the electron detection system is a time resolving electron detection system.

Herewith it is possible, after irradiating a short primary electron beam pulse onto the sample, to examine a time dependence of intensities of electrons emanating from the sample and thereby draw conclusions concerning the structure of the sample.

Preferably the electron detection system comprises an electron detector and an electron beam shutter, which allows the secondary electron beam to traverse the shutter only during predetermined or selectable time intervals. Thereby it is possible for the detector to detect secondary electrons, which start from or emanate from the sample within a time window corresponding to the time interval after the impinging of the primary electron beam pulse onto the sample. The electron beam shutter preferably comprises a beam deflector and a beam stop having an aperture arranged in the beam path downstream of the beam deflector. The beam deflector is then controllable to continuously vary a deflection angle for the secondary electron beam during a time interval such that the beam continuously scans across the beam stop and during a comparatively long time impinges on the beam stop, and only during a comparatively short time is transmitted through the aperture. Thereby it is possible to set a particularly narrowly defined time window.

According to an exemplary embodiment, the electron microscopy system comprises a control system, which is adapted to set a time interval between the time interval during which the secondary electron beam is incident on the electron detector, and a generation interval during which the electron beam source generates the primary electron beam pulse, and/or during which the primary electron beam pulse impinges on the sample. Thereby it is possible to shift the time window during which the secondary electrons are detected relative to the impinging of the primary electron beam pulse, and to thereby record a time spectrum of the secondary electrons generated by the primary electron beam pulse.

According to a further exemplary embodiment, the electron detection system comprises a beam deflector and a position sensitive electron detector arranged in a beam path of the secondary electron beam downstream of the beam deflector. Thereby it is possible to control the beam deflector in such a way that it continuously varies the deflection angle for the secondary electron beam, and thereby scans successively different locations on the position sensitive electron detector. Electron intensities, which are detected by different radiation sensitive elements or pixels of the detector then represent electron intensities which impinge at different times on the electron detector.

Further, it is possible that the beam deflector deflects the secondary electron beam in only one direction, and the position sensitive electron detector is a one-dimensionally position sensitive detector, or a line detector which is arranged relative to the beam deflector in such a way that upon variation of the deflection angle of the beam deflector, the location on the line detector at which the secondary electron beam impinges on the detector is also varied.

According to a further embodiment, the position sensitive electron detector is a two-dimensionally position sensitive detector, and the beam deflector is adapted to deflect the secondary electron beam in two directions, which are transverse to one another. Thereby it is possible that the locations of impinging of the secondary electron beam on the detector are on a ring shaped track, which may be a closed ring shaped track or a track comprising a part of a ring. Thereby it is possible that the beam scans the detector with a constant velocity and an achievable time resolution of the electron detection system is independent of the deflection angle of the beam deflector.

According to a further exemplary embodiment, an energy filter is provided in the beam path of the secondary electron beam for setting a predetermined or selectable kinetic energy of the secondary electrons capable of traversing the energy filter. Thereby it is possible to limit the time resolved examination to certain energies of the electrons emanating from the sample. In this way, for example, so-called back scattering electrons (BSE) which emanate from the sample at the same time as the secondary electrons SE1 may be separated from the secondary electrons SE1 in order to limit the examination only on the back scattering electrons BSE, for example.

According to a further exemplary embodiment, a beam splitter is provided for combining beam paths of the primary electron beam and the secondary electron beam between the beam splitter and the object plane such that the beam paths between the electron beam source and the beam splitter on the one hand, and between the beam splitter and the electron detector on the other hand, are separated from one another. According to an embodiment, the beam splitter is provided by a component of the energy filter.

The beam splitter or the energy filter, respectively, can be adapted such that the secondary electron beam having traversed the energy filter is oriented in different angular directions in dependence of the electron energy. Thereby the secondary electron beam is spread out in different angles within a beam plane. The beam deflector then preferably deflects the secondary electrons in a direction transverse to this beam plane towards the detector. When the detector is a two-dimensionally position sensitive detector, it is possible to examine the secondary electrons both with respect to their energy and with respect to their occurrence in time.

According to a further exemplary embodiment, the pulsed electron beam source comprises a beam deflector and a beam stop having an aperture arranged in the beam path downstream of the beam deflector. It is then possible to continuously vary the deflection angle of the beam deflector such that the beam impinges on the beam stop during a comparatively long time and is absorbed by the beam stop, and traverses through the aperture only during a comparatively short time. Thereby it is possible to generate primary electron beam pulses of particularly short duration. Alternatively, the pulsed electron beam source comprises a pulsed photon source generating a pulsed photon beam incident on an electron emitting body of the electron beam source. The electron emitting body may be heated and/or biased at a negative electric potential with respect to a beam stop such that, when no photons are incident on the electron emitting body, substantially no electrons will be emitted, apart from a dark current, and when photons of the photon source are incident on the electron emitting body, an electron current will be emitted therefrom. Thereby, a time pattern with which electrons are emitted from the electron emitting body follows a time pattern with which the photon source is controlled. The photon source, for example, a solid state laser or a LED, may be controlled electronically with a high time resolution such that it is possible with this arrangement to also generate electron beam pulses with a well defined time structure, and particularly with a short pulse duration.

According to an exemplary embodiment, the pulsed electron beam source and the electron detection system have common components. For example, a beam deflector may have a function of deflecting the primary electron beam with respect to an aperture such that it traverses the aperture only during short time intervals, and also to deflect the secondary electron beam such that it impinges on different locations of a position sensitive detector in dependence of time. A time resolution of the electron detection system is preferably better than 100 ps, more preferably better than 50 ps and most preferably better than 10 ps.

BRIEF DESCRIPTION OF THE DRAWINGS

The forgoing as well as other advantageous features of the invention will be more apparent from the following detailed description of exemplary embodiments of the invention with reference to the accompanying drawings, wherein:

FIG. 10$b$ are illustrations of aberrations of a focusing lens for charged particles;

DETAILED DESCRIPTION OF EXEMPLARY EMBODIMENTS

Figure 1:
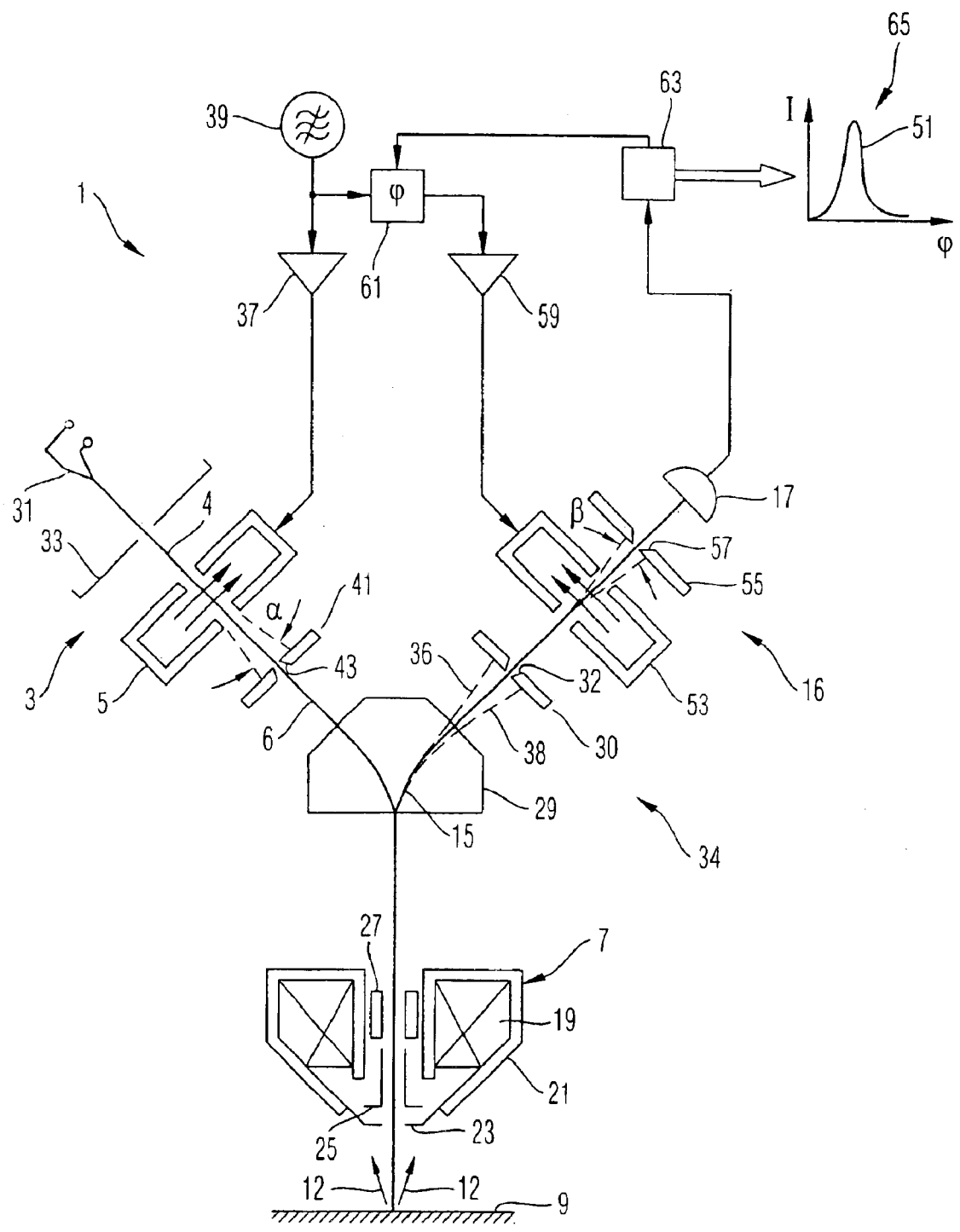
FIG. 1 is a schematic illustration of an electron microscopy system according to a first embodiment of the invention.

In the exemplary embodiments described below, components that are alike in function and structure are designated as far as possible by like reference numerals. Therefore, to understand the features of the individual components of a specific embodiment, the descriptions of other embodiments and of the summary of the invention should be referred to.

An electron microscopy system 1 shown schematically in FIG. 1 comprises an electron beam source 3 for generating a primary electron beam 6 and an objective lens 7 for focusing the primary electron beam 6 onto a surface of a sample 11 to be examined and arranged in an object plane 9 of the objective lens 7. The primary electron beam 6 focused onto the sample surface 9 generates secondary electrons 12 which emanate from the sample surface 9. A part of the secondary electrons 12 enters into the objective lens 7 and is shaped by same to a secondary electron beam 15, which eventually reaches an electron detector 17 of an electron detection system 16.

The objective lens 7 comprises a magnetic focusing lens having a focusing coil 19 surrounded by pole pieces 21, and a pair of electrodes 23 and 25 arranged at a distance from one another in the beam direction. A voltage is applied to electrodes 23, 25 such that an electric field is generated between electrodes 23 and 25, for decelerating the electrons of the primary electron beam 6 before they impinge on the sample surface 9, and which accelerates the secondary electrons 12 upon their entering into the objective lens 7. In a bore of the objective lens there are further provided deflecting coils 27 which deflect the primary electron beam 6 such that same impinges on selectable locations of the sample surface 9 by controlling the deflecting coils 27. It is thereby possible to scan the focused primary electron beam across the sample surface 9 and to detect with a detector 17 intensities of electrons 12 emanating from the sample, in dependence of locations on the sample surface 9 where the primary electron beam is focused.

Between the electron source 3 and the objective lens 7 there is arranged a beam splitter 29 which provides a magnetic deflecting field for the primary electron beam 6 and the secondary electron beam 15. With the beam splitter 29, beam paths of the primary electron beam 6 and the secondary electron beam 15 are brought into superposition between the beam splitter 29 and the object surface 9, while the beam paths between the electron beam source 3 and beam splitter 29 and between the beam splitter 29 and the electron detector 17, respectively, are separated from one another.

As far as so far described, the electron microscopy system 1 has a configuration similar to a configuration of a conventional scanning electron microscope (SEM).

However, in contrast to the conventional SEM, the electron beam source 3 is a pulsed electron beam source which periodically generates primary electron beam pulses or bunches of a pulse duration of about 20 ps.

To this end the electron beam source 3 comprises a heated cathode 31 and an anode 33 biased positively against the heated cathode 31. With this arrangement, initially a continuous electron beam 4 is generated which enters into a cavity resonator 5. The cavity resonator 5 is supplied with a high frequency power from a high frequency amplifier 37 which amplifies a high frequency of about 2.5 GHz provided by a high frequency generator 39. The high frequency amplifier 37 is a solid state amplifier, but may also be formed by a Klystron or Magnetron. The amplifier 37 provides a power of about 10 W for the operation of the cavity resonator 5. The high frequency power is supplied to the resonator in such a manner that therein an electromagnetic alternating field is excited which oscillates in a $TM_{110}$ mode.

Due to the alternating electromagnetic field, the continuous electron beam 4 entering into the cavity resonator 5 is deflected by alternating angles α in the drawing plane of FIG. 1. In the beam path downstream of the cavity resonator 5, a beam stop 41 having a small circular aperture 43 is arranged. The deflected continuous electron beam 4 impinges on the beam stop 41 and is absorbed by same at deflecting angles larger than a small threshold value. At deflecting angles smaller than the small threshold value the continuous beam 4 is incident on the aperture 43 and can therefore traverse the beam stop 41. Downstream of the beam stop 41, the pulsed primary electron beam 6 emerges, the beam pulses of which have a duration of about 20 ps, wherein the individual pulses are generated with a repetition frequency of about 5 GHz. A temporal evolution of an electron intensity in such a primary electron beam pulse is depicted in the upper part of FIG. 2.

Figure 3:
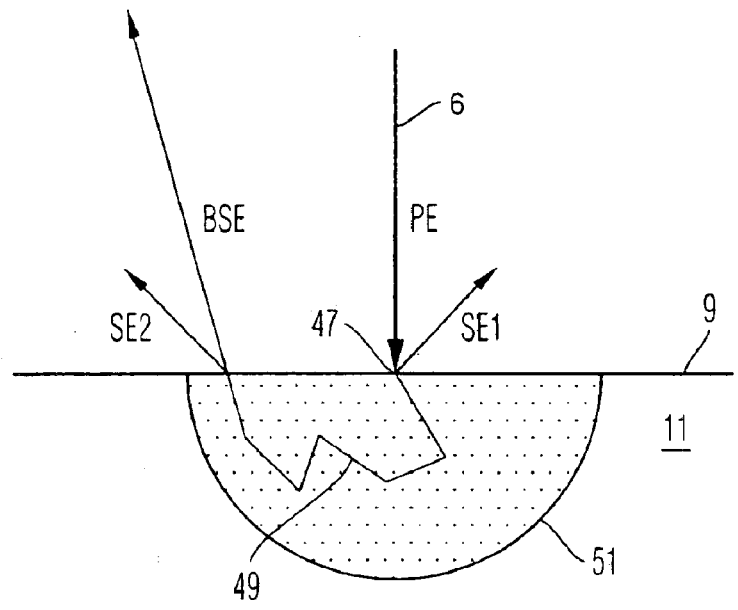
FIG. 3 is an illustration of processes for generating secondary electrons emanating from a sample.

In FIG. 3, processes are illustrated which result in the secondary electrons emanating from the sample 11. The primary electron beam 6 is directed onto a location 47 on the sample surface 9 by the objective lens 7. An impinging primary electron may directly release one or more secondary electrons SE1 from the sample surface 9 at the location 47. Furthermore, the primary electron may penetrate into the sample 11 wherein it is scattered one or more times, as indicated by a trajectory 49 in FIG. 3. A line 51 indicates a periphery of a scattering volume around the location 47. The scattering volume within line 51 is that volume within the bulk of the sample which may be reached by scattered primary electrons of a given kinetic energy. Finally, in some cases, the primary electron is scattered in such a way that it exits the sample as a back scattering electron BSE, and it may release further secondary electrons SE2 from the sample. As the primary electron has to move along the trajectory 49 before exiting as a back scattering electron BSE, the back scattering electron BSE and the secondary electrons SE2 emanate at a later time from the sample than the secondary electrons SE1.

Figure 2:
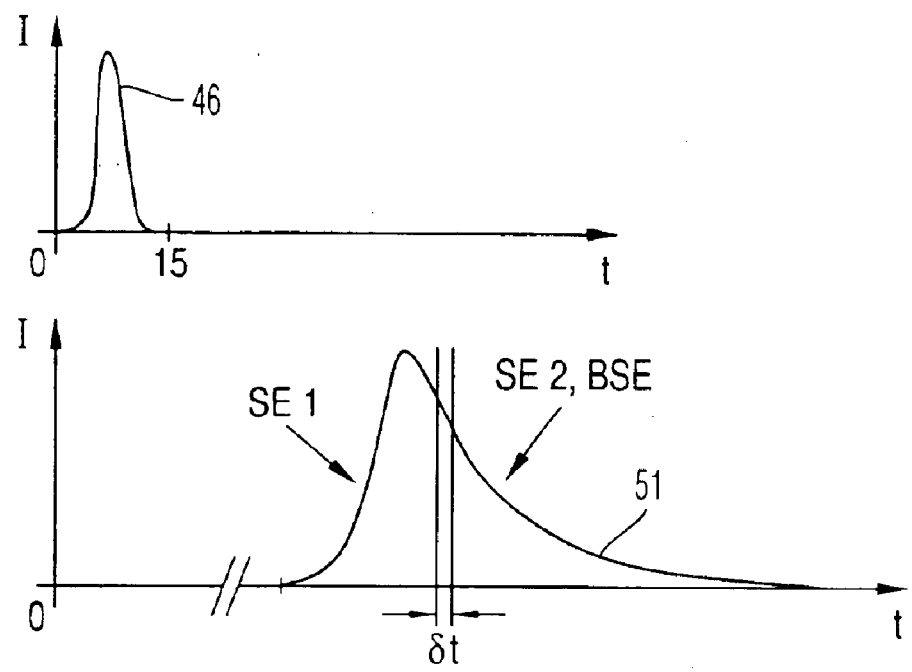
FIG. 2 is a graph for illustrating a time structure of electron beam pulses.

A time dependence of the electrons emanating from the sample 9 and caused by the primary electron pulse 46 is depicted at the bottom of FIG. 2. It appears that an intensity distribution 51 of the electrons emanating from the sample is substantially broader than that of the primary electron pulse 46. At the beginning of the pulse 51 its intensity is provided substantially by secondary electrons SE1. Towards its end, its intensity is provided substantially by secondary electrons SE2. Back scattering electrons BSE are released, depending on a penetrating depth into the scattering volume, over the entire pulse duration.

In order to resolve the time dependence of the pulse 51 of secondary electrons, the electron detection system 16 comprises, in addition to the electron detector 17 itself, a further cavity resonator 53 in the beam path of the secondary electron beam 15. The cavity resonator 53 is arranged between the beam splitter 29 and the detector 17. Between the cavity resonator 53 and the detector 17 there is further provided a beam stop 55 with an aperture 57. The cavity resonator 53 is supplied with a high frequency power from a high frequency amplifier 59, which also amplifies the high frequency provided by the high frequency generator 39 wherein, however, between the high frequency generator 39 and the high frequency amplifier 59, a phase shifter 61 is provided. The phase shifter 61 is controlled by a controller 63 to set a phase angle $\phi$ between the high frequencies amplified by the amplifiers 37 and 59.

Similarly as explained in the case of the high frequency cavity resonator 5 and its associated beam stop 41 in the beam path of the primary electron beam 6, the cavity resonator 53 periodically changes a deflection angle $\beta$ of the secondary electron beam traversing the resonator 53 in the plane of the drawing of FIG. 1 such that only during a short time window the secondary electron beam 15 reaches the detector 17 through the aperture 57. Such time window $\delta t$ is indicated in the graph at the bottom of FIG. 2 at a given phase shift $\phi$. The width of this time window $\delta t$ is about 20 ps, and thereby determines the time resolution of the electron detection system 16.

For a given setting of the phase angle $\phi$, the controller 63 reads a detected electron intensity from the electron detector 17 and stores same. Then, the controller 63 changes the angle $\phi$ and thereby shifts the time window $\delta t$ along the time axis in order to again detect the secondary electron intensity per time unit at this changed setting. By repeatedly changing the phase angle $\phi$ and reading out the detector 17, the controller 63 records the secondary electron pulse 51 in dependence of the phase angle $\phi$ and outputs the recorded data, for example in the form of the diagram 65 which is shown in FIG. 1, or in any other possible form of information. For a given frequency of the high frequency generator 39, the diagram 65, showing the intensity I depending on the phase angle $\phi$, may be transformed into the time diagram as depicted at the bottom of FIG. 2, showing the intensity I depending on time t. Thus it is possible with the electron microscopy system 1 shown in FIG. 1 to detect the time dependence of the secondary electron pulse 51 as generated by the primary electron pulse 46.

This process may be repeated for a multitude of locations 47 of the sample surface 9 by changing the deflections caused by the deflection coils 27. From different time dependencies of the secondary electron pulses 51 at the different locations 47, structure information of the sample 11 may be obtained.

The beam splitter 29 has together with a beam stop 30 having an aperture 32, a function of an energy filter 34. Secondary electrons of a given energy traverse the beam stop 30 through its aperture 32 while higher energy electrons are deflected by the beam splitter 29 by a smaller angle and impinge on the beam stop 30, as indicated in FIG. 1 by a beam 36. Lower energy electrons are deflected by the beam splitter 29 by a larger angle and also impinge on the beam stop 30 as indicated by a beam 38.

Figure 4:
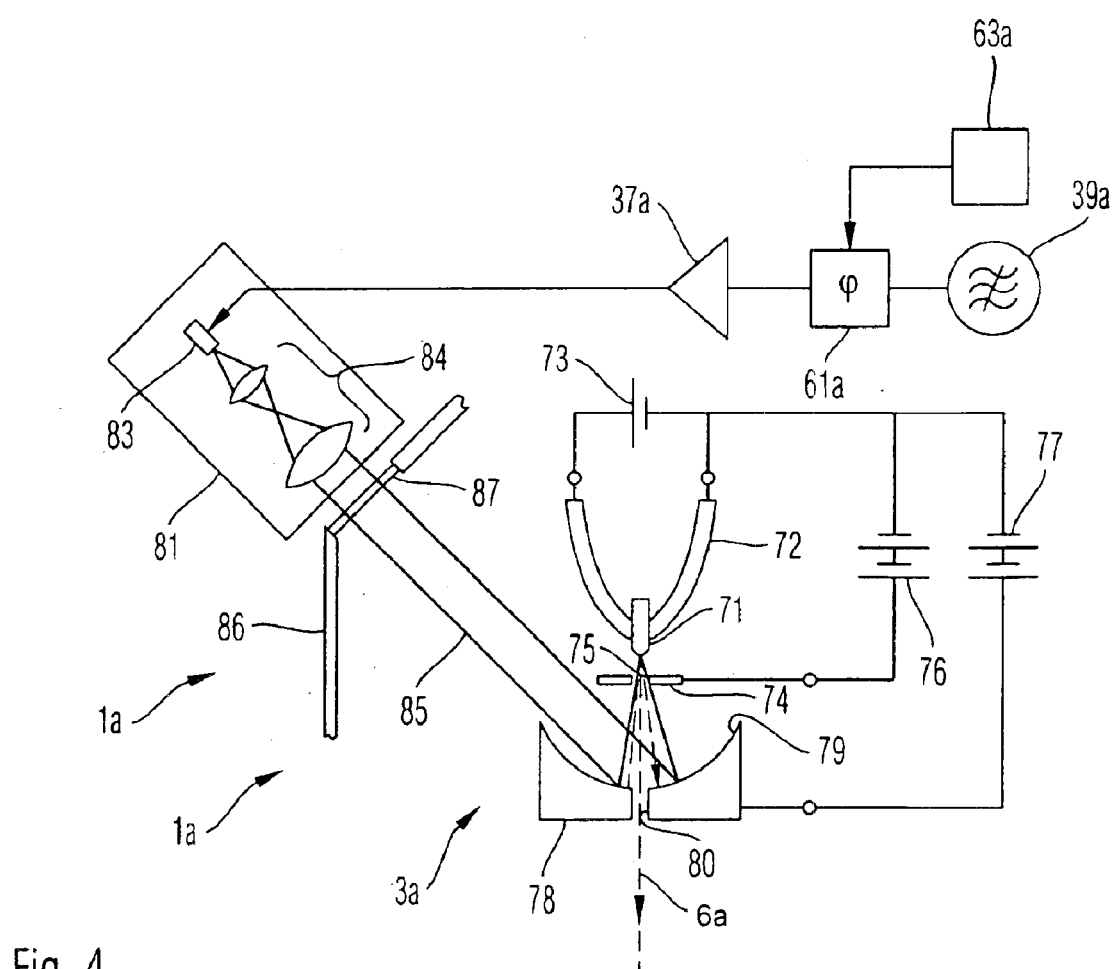
FIG. 4 is a schematic illustration of a pulsed electron beam source which may be used in the electron microscopy system according to FIG. 1.

In the embodiment illustrated with reference to FIG. 1, the pulsed electron beam source uses the cavity resonator as a beam deflector. An alternative embodiment of a pulsed electron beam source 3a is schematically illustrated in FIG. 4. The source 3a comprises a thermally heated cathode body 71 which is mounted on a V shaped heating wire 72. The heating wire 72 is supplied by a current source 73 for heating the cathode body 71. A beam stop electrode 74 with an aperture 75 is arranged at a distance from a tip of the cathode body 71. A high voltage source 76 is provided for biasing the anode beam stop 74 against the cathode body 71. A further beam stop electrode 78, which is arranged at a distance from the beam stop electrode 74, is also biased against the cathode body 71 by a further high voltage source 77. The further beam stop electrode 78 has a central aperture 80 and a parabolic mirror surface 79 facing towards the beam stop electrode 74 and the cathode body 71.

A photon source 81 having a light emitting diode 83 and a collimation optics 84 is provided for generating a substantially parallel collimated photon beam 85. The photon source 81 is arranged outside of a vacuum container 86 of an electron microscopy system 1a, and the photon beam 85 enters via a window 87 of the vacuum container 86 into the evacuated space of the electron microscopy system 1a to be incident on the mirror 79 having the parabolic surface. The beam stop electrode 78 with the parabolic mirror surface 79 is arranged relative to the cathode body 71 in such a way that the photon beam 85 is focused onto the tip of the cathode body 71.

When the photon beam 85 is switched on, electrons are emitted from the cathode body 71, wherein the thermal excitation of the electrons in the cathode body 71, the electrical field provided between the cathode body 71 and the anode stop 74 and a photo effect caused by the photons of the beam 85 act together to release electrons from the cathode body 71. If the photon beam 85 is switched off, the thermal excitation of the electrons of the cathode body 71 and the action of the electrical field between the cathode 71 and the anode 74 are not sufficient to release electrons of a substantial intensity from the cathode body 71, apart from a remaining dark current.

By rapidly switching the photon beam 85 on and off it is thereby possible to generate a pulsed electron beam 6a with electron beam source 1a. For switching the photon source 81 on and off, the light emitting diode 83 is supplied with a high frequency power from a high frequency amplifier 37a, which is supplied with a high frequency generated by a high frequency generator 39a, wherein a phase shifter 61a controlled by a controller 61a of the electron microscopy system 1a is connected between the generator 39a and the amplified 37a.

The pulsed electron beam source explained in conjunction with FIG. 4 may replace the electron beam source in the electron microscopy system 1 shown in FIG. 1.

It is to be noted that the electron beam source in the embodiment illustrated with reference to FIG. 1 is not limited to the sources shown in FIGS. 1 and 4. Rather, any other possible pulsed electron beam source which provides sufficiently short electron pulses may be used with the invention.

Figure 5:
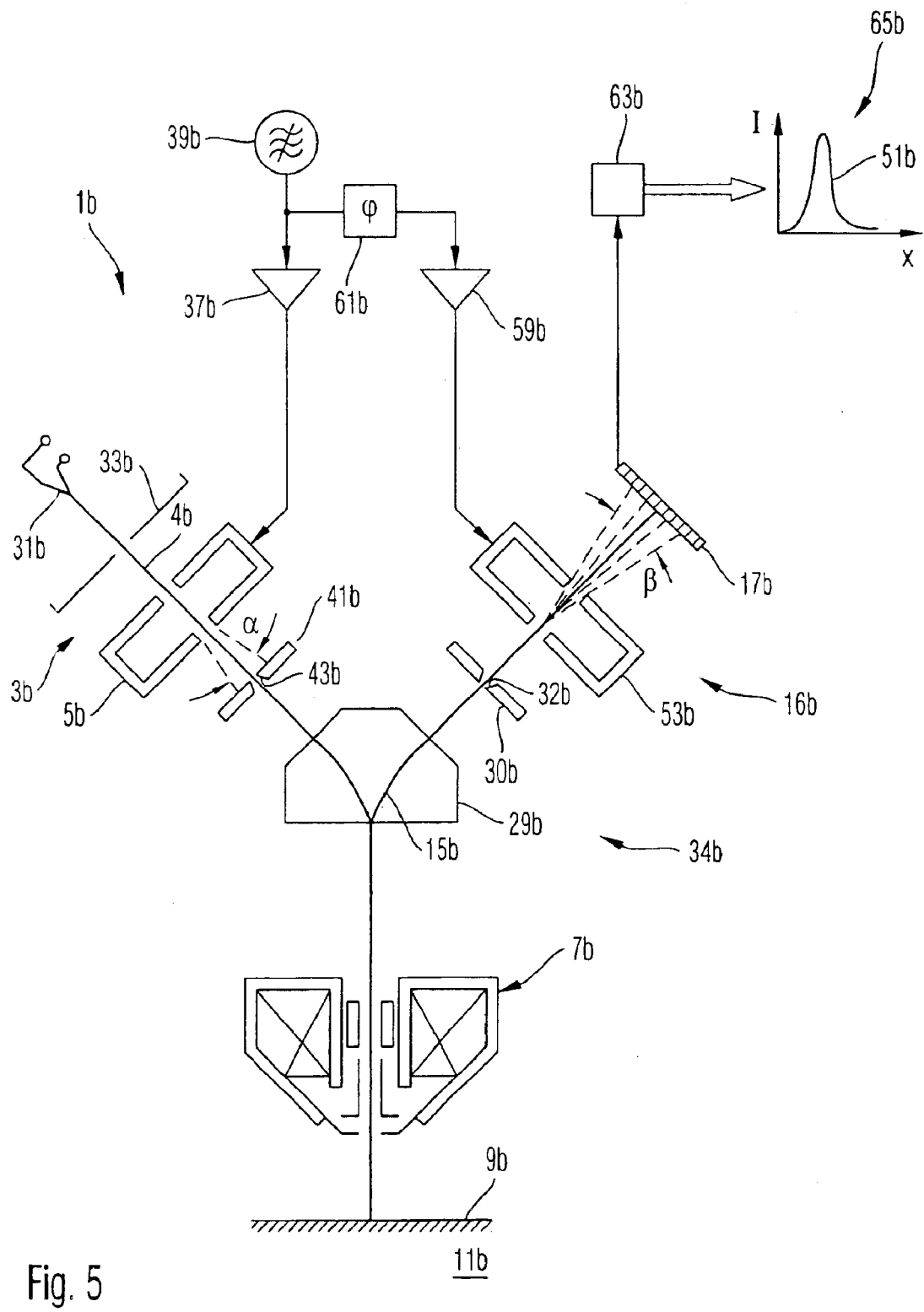
FIG. 5 is a schematic illustration of an electron microscopy system according to a second embodiment of the invention.

An electron microscopy system 1b, schematically depicted in FIG. 5, has a configuration similar to that shown in FIG. 1. In particular, a pulsed electron beam source 3b, an objective lens 7b, and an energy filter 34b have a structure similar to those of the corresponding components shown in the system according to FIG. 1.

An electron detection system 16b of the electron microscopy system 1b also comprises a cavity resonator 53b, which is supplied from a high frequency amplifier 59b, to which the high frequency of the high frequency generator 39b is supplied via a phase shifter 61b. However, here an electron detector is provided as a one-dimensionally position sensitive electron detector, or a line detector 17b respectively, and a beam stop corresponding to the beam stop 55 of FIG. 1 is not provided in the electron detection system 16b between the cavity resonator 53b and the line detector 17b. Therefore, independent of the deflection angle β, which is provided by the cavity resonator 53b for the secondary electron beam 15b in the plane of the drawing of FIG. 5, the electrons of the secondary electron beam 15b impinge on the electron detector 17b at substantially all times. However, along with variations of the deflection angles β, also the impinging locations of the electrons on the line detector 17b change, such that locations x on the line detector 17b correspond to the deflection angles β. The deflection angles β are in turn time dependent, such that the electron intensities detected in dependence of the location x on the detector 17b represent the time dependence of secondary electron pulses 51b. For recording this time dependence of the secondary electron pulses 51b, for example as diagram 65b, a controller 53b which reads out the position sensitive detector 17b, does not necessarily have to change the phase angle ϕ provided by the phase shifter 61b, in contrast to the embodiment shown in FIG. 1. The phase angle ϕ may, for example, be fixed in advance. However, it is also possible that the controller 53b also varies the phase angle ϕ, for example in order to change a measuring range which is accessible with limited deflection angles β, or a limited extension or resolution of the line detector 17b.

Since the deflection angle β provided by the beam deflector provided as the cavity resonator 53b varies sinusoidally with time, the time resolution of the electron detection 16b depends on the deflection angle β, and is in particular reduced at both ends of the line detector 17b, when the spatial resolution of the detector 17b is constant over the length of the line detector 17b.

Figure 6:
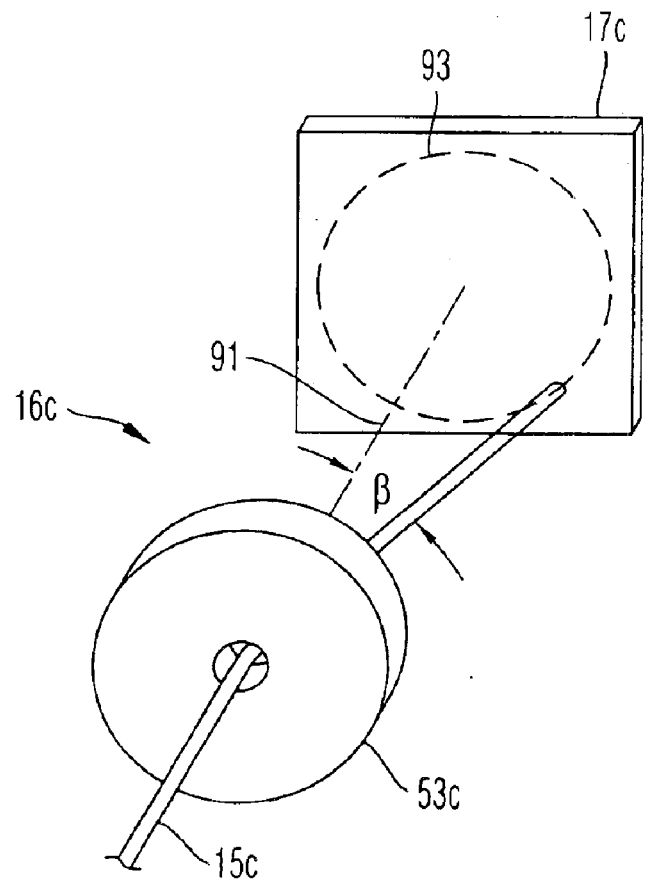
FIG. 6 is a perspective schematic illustration of an electron detection system which may be used in the electron microscopy system according to FIG. 5.

In FIG. 6, an electron detection system 16c is schematically depicted in a perspective representation. The electron detection system 16c provides a substantially equal time resolution over a deflection cycle of a cavity resonator 53c. A two-dimensionally position sensitive electron detector 17c is disposed in the beam path of a secondary electron beam 15c downstream of the cavity resonator 53c. The cavity resonator 53c is excited by a high frequency amplifier, not shown in FIG. 6, in such a way that it oscillates in two mutually perpendicular $TM_{110}$ modes. Electromagnetic high frequency fields rotate about a symmetry axis 91 of the cavity resonator 53c and the secondary electron beam 15c is deflected by an angle β of a constant magnitude, the orientation in space of which, however, rotates uniformly around the symmetry axis 91, such that the secondary electron beam 15c impinges on the position sensitive detector 17c along a circular line 93. The beam 15c scans over the circular line 93 with a uniform velocity. Electron intensities registered along the circular line 93 therefore represent a time dependence of a secondary electron pulse 51, as depicted in FIG. 2.

In the embodiment shown in FIG. 6, the electron detector 17c is a two-dimensionally resolving detector having, for example, an array of electron sensitive pixels.

It is, however, possible to use a detector having plural electron sensitive sectors disposed adjacent to each other in a circumferential direction about axis 91.

The electron detection system according to FIG. 6 may be used in the embodiment of the electron microscopy system according to FIG. 5, or in any other embodiment described in the preceding sections or below.

Figure 7:
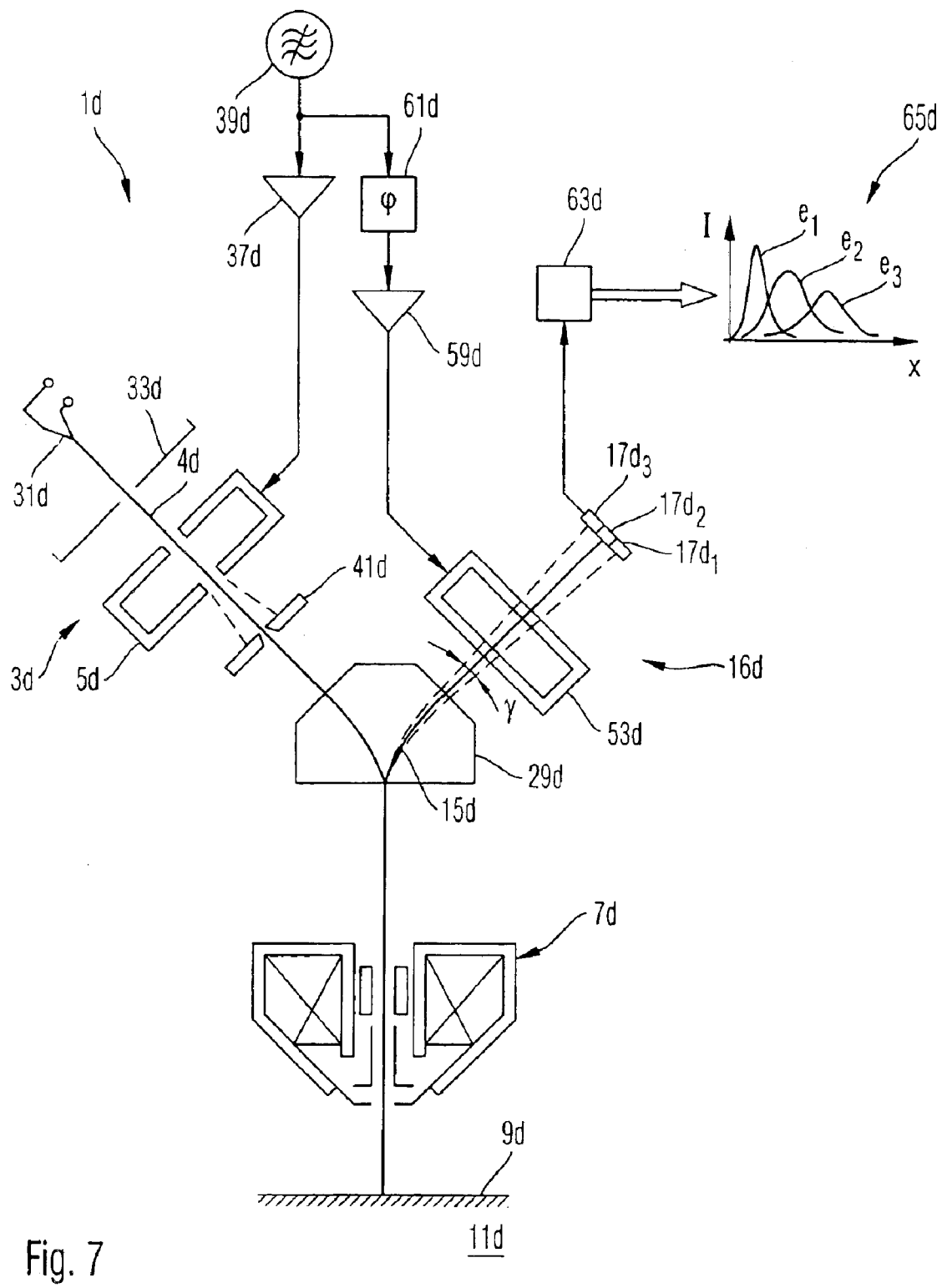
FIG. 7 is a schematic illustration of an electron microscopy system according to a third embodiment of the invention.

An electron microscopy system 1d schematically illustrated in FIG. 7 has a configuration similar to that of the system shown in FIG. 5. An electron detection system 16d, again comprises a cavity resonator 53d and a position sensitive electron detector. However, three line detectors, 17b₁, 17d₂ and 17d₃, are arranged side by side, which are, in comparison with the line detector shown in FIG. 5, rotated by 90° about a symmetry axis of the cavity resonator 53d such that a direction of extension of the line detectors 17d₁ to 17d₃ is oriented perpendicular to the plane of the drawing in FIG. 7. The cavity resonator 53d is excited in such a manner that the deflection angles β generated by the resonator extend transversely to the plane of the drawing. At different points in time, different locations along the direction of extension of the line detectors are irradiated by electrons of the secondary electron beam 15d.

In contrast to the embodiment illustrated with reference to FIG. 5 above, the electron microscopy system id does not comprise an energy filter. In particular, a beam stop corresponding to the beam stop 30b of FIG. 5 is not provided in the beam path between the beam splitter 29d and the cavity resonator 53d. Due to the energy dispersing function of the magnetic field provided in the beam splitter 29d, the secondary electron beam 15d is spread by an angle γ in the plane of the drawing of FIG. 7 before entering the cavity resonator 53d. The cavity resonator 53d does not change the directions of propagation of the entering secondary electrons of beam 15d in the plane of the drawing of FIG. 7. Secondary electrons from three different energy bands are incident on the three line detectors 17d₁ to 17d₃ wherein each line detector 17d₁, 17d₂, 17d₃ is associated with one of the three energy bands.

By reading out the three line detectors, the controller 63d obtains time dependent intensity spectra of the secondary electron pulse, similarly as depicted at the bottom of FIG. 2. However, the spectra are obtained for three different energy groups: A graph 65d in FIG. 7 shows a pulse $e_1$ for a low secondary electron energy as recorded by detector $17d_1$; a pulse $e_2$ of secondary electrons of medium energy as recorded by detector $17d_2$; and a pulse $e_3$ of secondary electrons of high energy as recorded by line detector $17d_3$.

In the embodiment explained with reference to FIG. 4, three line detectors are provided. However, it is also possible to increase the number of line detectors, or to use a two-dimensionally position sensitive detector, such as a detector having an array of electron sensitive pixels. Detected electron intensities in dependence of a first direction of extension of the detector will then represent a time dependence, and intensities in dependence of a second direction of extension will represent an energy dependence.

Figure 8:
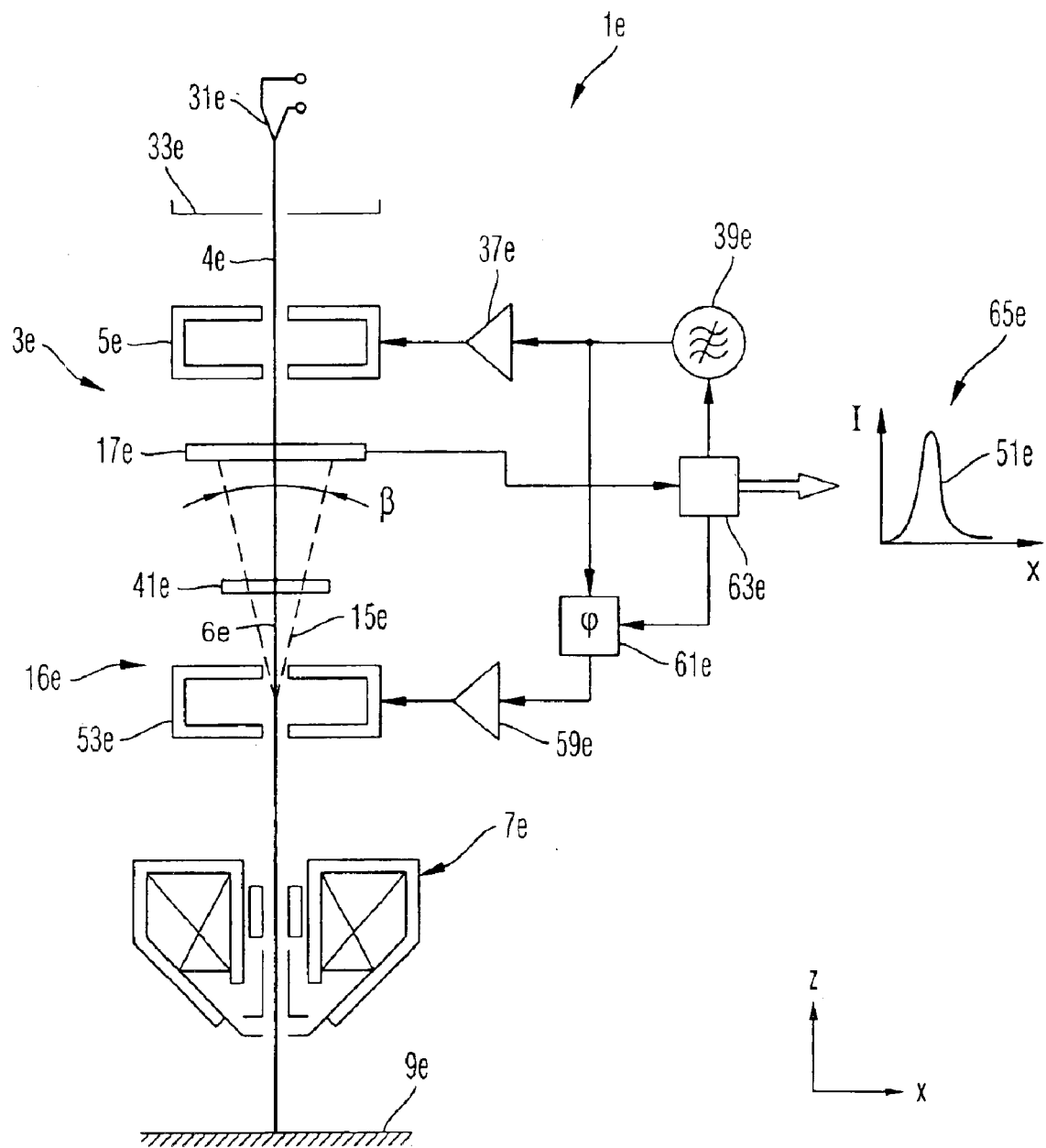
FIG. 8 is a schematic illustration of an electron microscopy system according to a fourth embodiment of the invention.

An electron microscopy system 1e schematically illustrated in FIG. 8 has a similar configuration as the system shown in FIG. 5. However, in the embodiment shown in FIG. 8, a beam splitter for separating the beam paths of the primary electron beam and the secondary electron beam is not provided, so that the primary and secondary electron beams coincide over a greater length of their beam paths, and components of an electron source 3e and components of an electron detection system 16e are disposed such that they are interlaced along the beam axis.

The electron source 3e comprises a cathode 31e, an anode 33e, a cavity resonator 5e and a beam stop 41e. The electron detection system 16e comprises a cavity resonator 53e and a position sensitive detector 17e.

The beam stop 41e of the pulsed electron source 3e is disposed between the cavity resonator 5e of the detection system 16e and the position sensitive line detector 17e. The beam stop 41e has a slit shaped aperture which extends in an x-direction and in the plane of the drawing of FIG. 8. The cavity resonator 5e of the source 3e deflects the primary electron beam transversely to the plane of the drawing (y-direction) such that the beam traverses the slit shaped aperture of the stop 41e only during comparatively short time durations such that a pulsed primary electron beam 6e is formed downstream of beam stop 41e.

The cavity resonator 53e of the detection system 16e deflects the secondary electron beam 15e periodically in the plane of the drawing (x-direction) such that the secondary electron beam traverses the aperture of the beam stop 14e extending in the x-direction at all times. The secondary electron beam is then incident on the line detector 17e also extending in the x-direction, such that the line detector 17e detects a time dependence of secondary electron pulses 51e.

The cavity resonators 5e and 53e are supplied with high frequency power by high frequency amplifiers 37e and 59e, respectively, wherein a phase angle φ between excitations of the cavity resonators 5e and 53e may be set by a phase shifter 61e controlled by controller 63e. The phase angle φ is set such that the primary electron beam pulses traverse the cavity resonator 53e at times in which the deflecting fields for the secondary electron beam provided by resonator 53e are substantially zero, such that the primary electron beam is substantially not deflected by the cavity resonator 53e.

A frequency of a high frequency generator 39e, the high frequency of which is amplified by amplifiers 37e and 59e, may be fixedly set or variable by the controller 63e. If the high frequency is variable, then it is also possible to replace the position sensitive detector 17e with a non-position sensitive detector and to replace the beam stop 41e having the slit shaped aperture with a beam stop having a small circular aperture. Thus it is possible to record the spectrum 51e by varying the frequency of the high frequency generated by generator 39e and to record the detected secondary electron intensities in dependence of the frequency.

The line detector 17e has a central bore for the primary electron beam 6e to traverse through the detector 17e.

Figure 9:
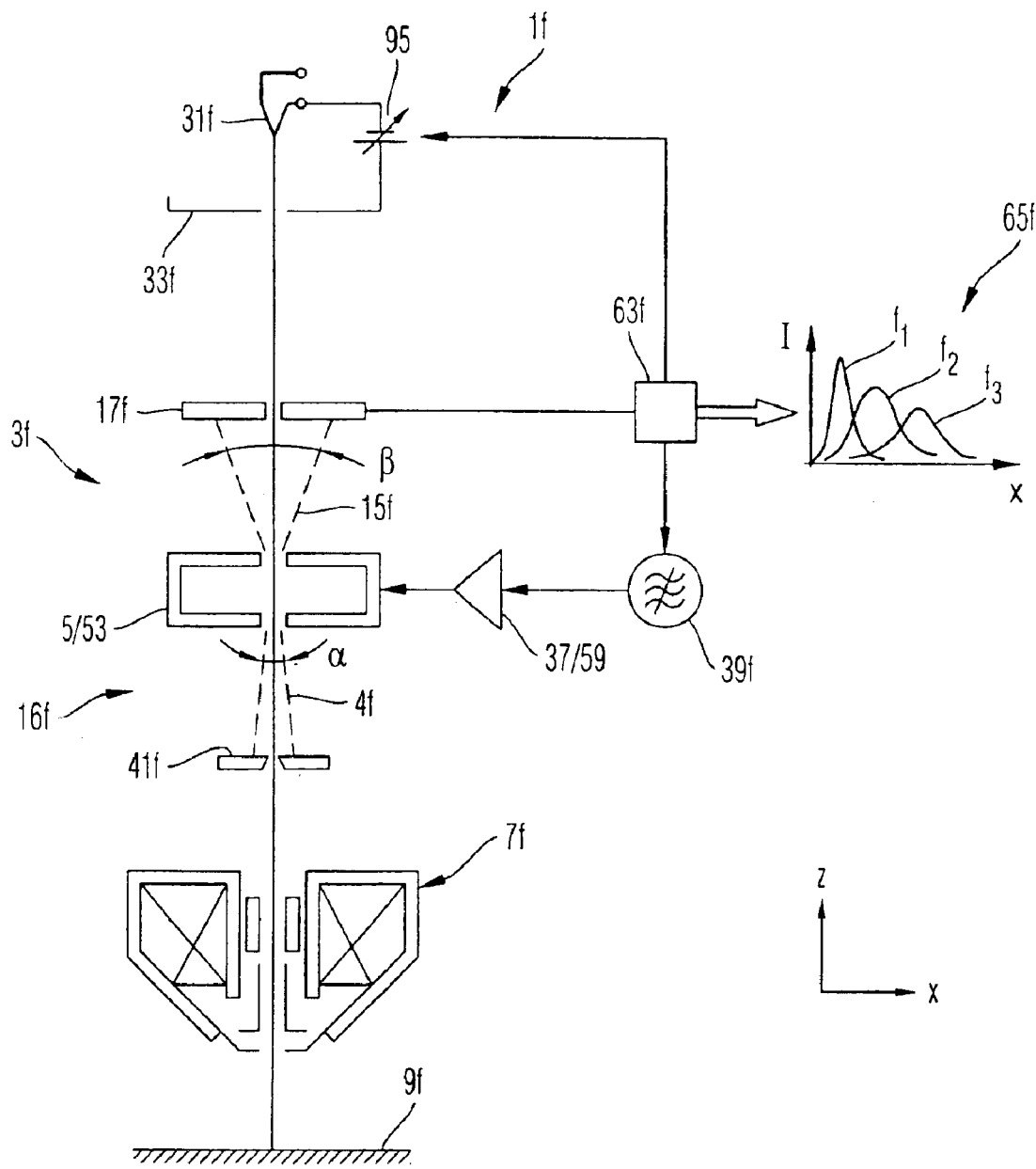
FIG. 9 is a schematic illustration of an electron microscopy system according to a fifth embodiment of the invention.

An electron microscopy system if schematically shown in FIG. 9 has a similar configuration as the system shown in FIG. 8 in that the system does not comprise a beam splitter and in that components of a detection system 16f and of an electron beam source 3f are interlaced in the direction of the beams (z-direction). However, the electron beam source 3f and the detection system 16f have as a common component a cavity resonator 5/53, which is traversed by the primary electron beam 4f and the secondary electron beam 15f. On both beams 4f and 15f, cavity resonator 5/53 acts as a beam deflector, which deflects the beams in the plane of the drawing of FIG. 9 with deflection angles varying in time. A beam stop 41f, which is arranged in the beam path of the continuous primary electron beam 4f downstream of the cavity resonator 5/53, shapes the pulses of the primary electron beam, which then traverse the objective lens 7f. A position sensitive line detector 17f, extending in the x-direction is arranged in the beam path of the secondary electron beam downstream of the cavity resonator 5/53 and records time spectra of the secondary electron pulses. However, this is only possible if the geometry of the electron microscopy system 1f shown in FIG. 9 meets certain conditions regarding times of flight of the primary electron beam pulses between the cavity resonator 5/53 and the sample surface 9f, as well as times of flight of the secondary electron beam pulses between the sample surface 9f and the cavity resonator 5/53. At a given primary electron energy, the required adjustment of the parameters is only achievable for certain high frequencies. Therefore the frequency of the high frequency generator 39f with which the cavity resonator 5/53 is supplied after amplification by a high frequency amplifier 37/59 is adjustable by a controller 63f which also reads out the detector 17f.

In order to be able to record different spectra, $f_1$, $f_2$ and $f_3$ of the secondary electron pulses, for different primary electron energies, the energy of the primary electrons is adjustable via the controller 63f by a controllable voltage source 95.

In each of the hitherto explained embodiments, which have an electron beam source with a cavity resonator, any other pulsed electron beam source is also usable, for example the electron beam source illustrated with reference to FIG. 4 above.

Furthermore, in each of the preceding embodiments, the kinetic energy of the primary electrons may be adjustable if so desired.

In the preceding embodiments, the cavity resonator in each case is just one option to provide deflection angles for the primary and/or secondary electron beams varying in time. Any other kind of beam deflectors may also be used. However, the embodiment of the beam deflectors as cavity resonators has the advantage that they store field energy or respectively transform electric and magnetic field energy into one another such that with a comparatively small power of the high frequency amplifiers, high field strengths and thereby comparatively large deflection angles are achievable.

Furthermore, the use of cavity resonators enables the switching of the electron beam with a high frequency of several GHz, such that electron pulses of a given pulse duration, which eventually determines the time resolution of the system, can follow each other in small intervals. A duty cycle of the pulsed beam is substantially higher than with conventional beam deflectors which are not provided as cavity resonators, but for example as plates of a capacitor or the like. Geometries of the cavity resonators may be designed by using a computer simulation such that desired magnetic and electrical fields of a desired oscillation mode are generated within the cavity to deflect the beams by desired angles.

Figure 10A:
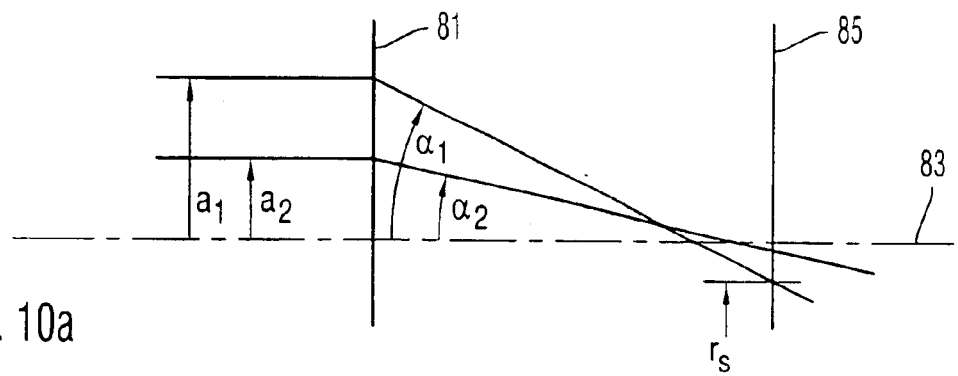
FIG. 10$a$.

FIG. 10a illustrates a spherical aberration of a focusing lens for charged particles, as for example of the objective lens 7 of the electron microscopy system illustrated with reference to FIG. 1 above. A lens plane of the focusing lens is indicated with reference numeral 81 in FIG. 10a, an optical axis of the focusing lens is indicated with reference numeral 83, and a focus plane of the lens is indicated with reference numeral 85. Considering two charged particles of respectively equal kinetic energy, which enter into the lens in parallel to the optical axis 83, the particle entering into the lens at a larger distance $a_1$ from the optical axis 83 will be deflected by the lens through a larger angle $\alpha_1$ than the particle entering into the lens with a smaller distance $a_2$ from the optical axis 83 which is only deflected by a smaller angle $\alpha_2$. However, these angles $\alpha_1$ and $\alpha_2$ are not of such a magnitude that the trajectories of the particles would intersect the optical axis 83 in the focus plane 85. Rather, the particles intersect the optical axis 83 upstream of the focus plane 85 such that they intersect the focus plane 85 at distances $r_s$ from the optical axis. $r_s$ is given by the following equation:

$$r_s = -\frac{1}{4}C_S\alpha^3, \quad (1)$$

wherein $C_s$ is the coefficient of the spherical aberration. $r_s$ also indicates a radius of an aberration disk caused by the spherical aberration of the lens.

Figure 10B:
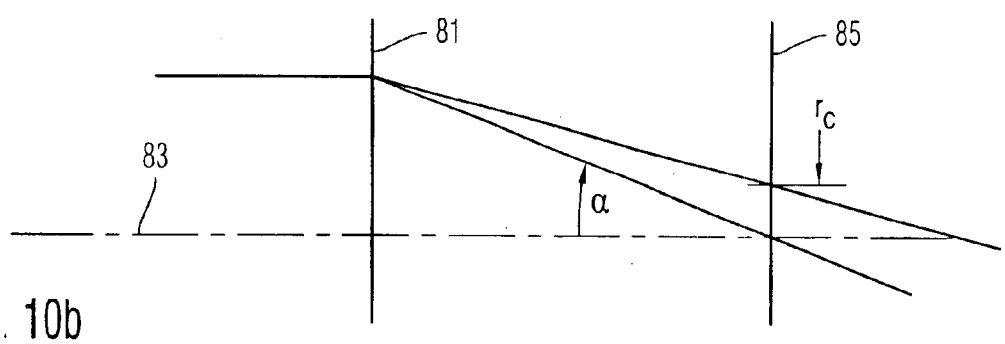

In the following a chromatic aberration of the focusing lens will be illustrated with reference to FIG. 10b. A charged particle having a given kinetic energy E enters into the lens in parallel to the optical axis 83 and at a distance therefrom and is deflected by an angle $\alpha$ in such a way that it intersects the optical axis 83 in the focus plane 85. A charged particle having a higher energy $E+\Delta E$ entering into the lens in the same manner is deflected by the lens by a smaller angle, such that its trajectory intersects the optical axis 83 only downstream of the focus plane 85. In the focus plane 85 the particle having the higher energy has a distance $r_c$ from the optical axis 83. $r_c$ is given by the following equation $$r_C = +C_C\frac{\Delta E}{2E}\alpha, \quad (2)$$

wherein $C_c$ is the coefficient for the chromatic aberration of the lens. $r_c$ also designates the aberration disk caused by the chromatic aberration.

By setting $r_s+r_c=0$, one obtains:

$$\Delta E = \frac{1}{2}\frac{C_S}{C_C} \cdot E \cdot \alpha^2. \quad (3)$$

It appears that the aberration of the focusing lens could be reduced by varying the energy in dependence of the angle $\alpha$.

Figure 11:
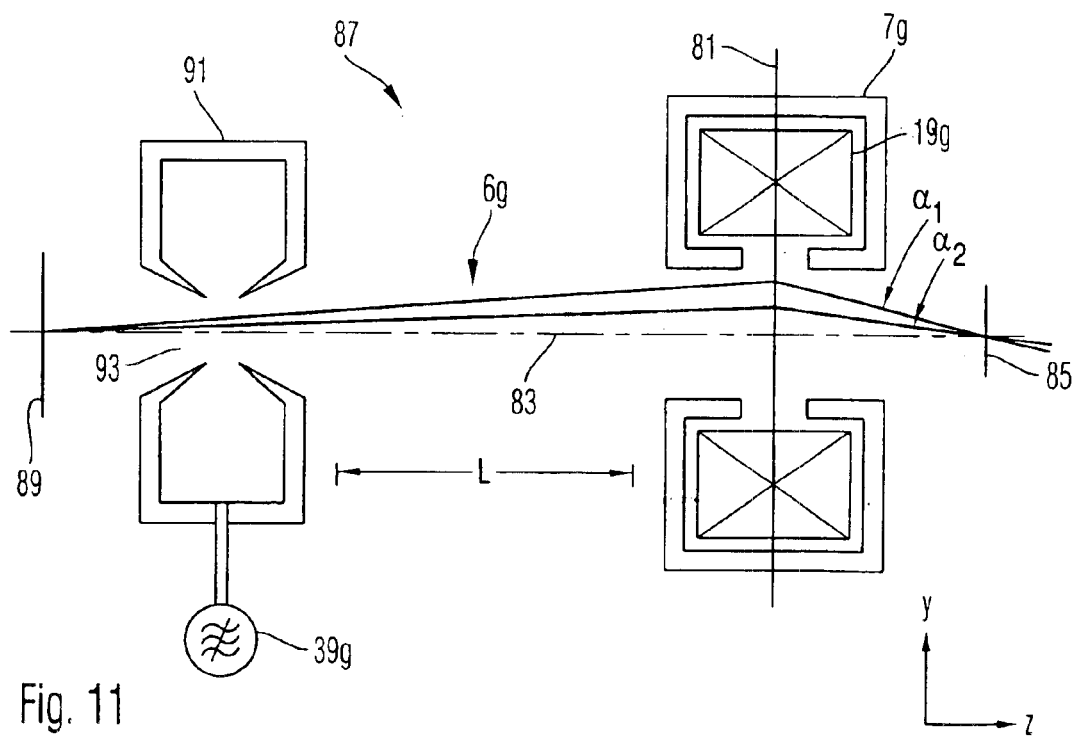
FIG. 11 is a schematic illustration of a focusing system according to an embodiment of the invention.

FIG. 11 shows a schematic drawing of a focusing system 87 which comprises a focusing lens 7g, wherein aberrations relating to a focusing of charged particles in a focusing plane are reduced. Charged particles of a pulsed particle beam 6g intersect an optical axis 83 of the focusing lens 7g upstream of the lens in a plane 89. This can be achieved, for example, by arranging a cathode of the source itself approximately in the plane 89, or by forming a crossover of the particle beam in the plane 89. However, the condition of such a crossover need not be fulfilled exactly. Between the plane 89 and the focusing lens 7g a high frequency resonator 91 is arranged which is traversed by the particle beam 6g in such a manner that the particles which are deflected by the focusing lens 7g by a larger angle $\alpha_1$ traverse the resonator 91 at a larger distance from the optical axis 83 than particles which are deflected by the lens 7g by a smaller angle $\alpha_2$.

A high frequency generator 39g supplies the resonator 91 with high frequency power in such a manner that a $TM_{010}$ mode is excited. An electromagnetic alternating field is generated such that an electrical component of the field is oriented along the optical axis 83 and accelerates or decelerates the charged particles according to a point in time in which same traverse a gap 93 of the resonator 91.

Figure 12:
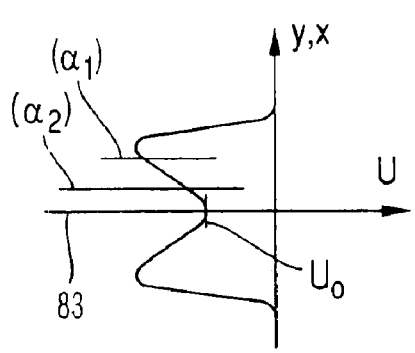
FIG. 12 is a graph of a radial dependency of an electrical field in a cavity resonator of the focusing system shown in FIG. 11.

In FIG. 12, a radial dependency of an electrical field at a time to is depicted. It appears that a field strength U of the electrical field is $U_0$ on the optical axis and increases with increasing distance from the optical axis 83 to a maximum value. The increase of the field is parabolic for small distances from the axis 83. At the time to the electrical field is orientated to accelerate negatively charged particles, such as electrons. Electrons traversing the gap 93 at a larger distance from the optical axis 83 receive a larger gain in kinetic energy than electrons which traverse the resonator 91 at a smaller distance from the optical axis 83. These particles enter the focusing lens 7g at an accordingly larger distance from the optical axis 83 and are deflected by the lens by too large angles $\alpha_1$ (compare FIG. 10a); since these particles will have gained the comparatively larger kinetic energy after traversing the resonator, the angle $\alpha_1$ will be somewhat reduced, such that the aberration $r_s$ will also be reduced. Ideally, the charged particles are deflected independent of their distance from the optical axis 83 in the lens plane 81 by such an angle $\alpha$ that they intersect the focus plane 85 substantially on the optical axis 83.

In the focusing system 87, as shown in FIG. 11, yet another mechanism for reducing the aberrations of the focusing lens 7g may be employed as explained in the following with reference to FIG. 13.

Figure 13:
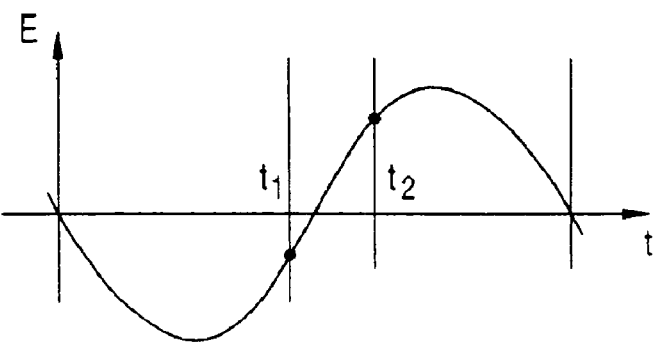
FIG. 13 is a graph of a temporal dependency of the field in the cavity resonator of the focusing system shown in FIG. 11.

FIG. 13 shows a temporal evolution of the accelerating respectively decelerating field in the gap 93 of the resonator 91. It is assumed that a leading edge of the particle pulse or bunch of particles enters the resonator at a time $t_1$ and a trailing edge of the bunch of particles enters the resonator at a time $t_2$. When the charged particles in the bunch show a distribution of their kinetic energies, particles with a comparatively higher kinetic energy will present in the leading edge of the particle bunch, while particles with a comparatively lower kinetic energy will be dominant in the trailing edge of the bunch. On the particles entering first, that is on the particles with the higher energy, the field has a decelerating function, while it has a accelerating function on particles entering later due to the temporal evolution of the field. Accordingly, the differences between the particles of the pulses regarding their kinetic energy are reduced by the action of the resonator 91, and thereby also an effect of the aberration of the focusing lens 7g will be reduced (compare FIG. 10b).

The mechanism of reducing aberrations of lens 7g by the resonator 91 and illustrated with reference to FIGS. 12 and 13 may complement each other. However, it is also possible that the mechanism according to FIG. 12 or the mechanism according to FIG. 13 dominates.

The principles of the focusing system illustrated with reference to FIG. 11 may be employed for focusing of beams of charged particles of any type, such as electrons, myons and ions.

Figure 14:
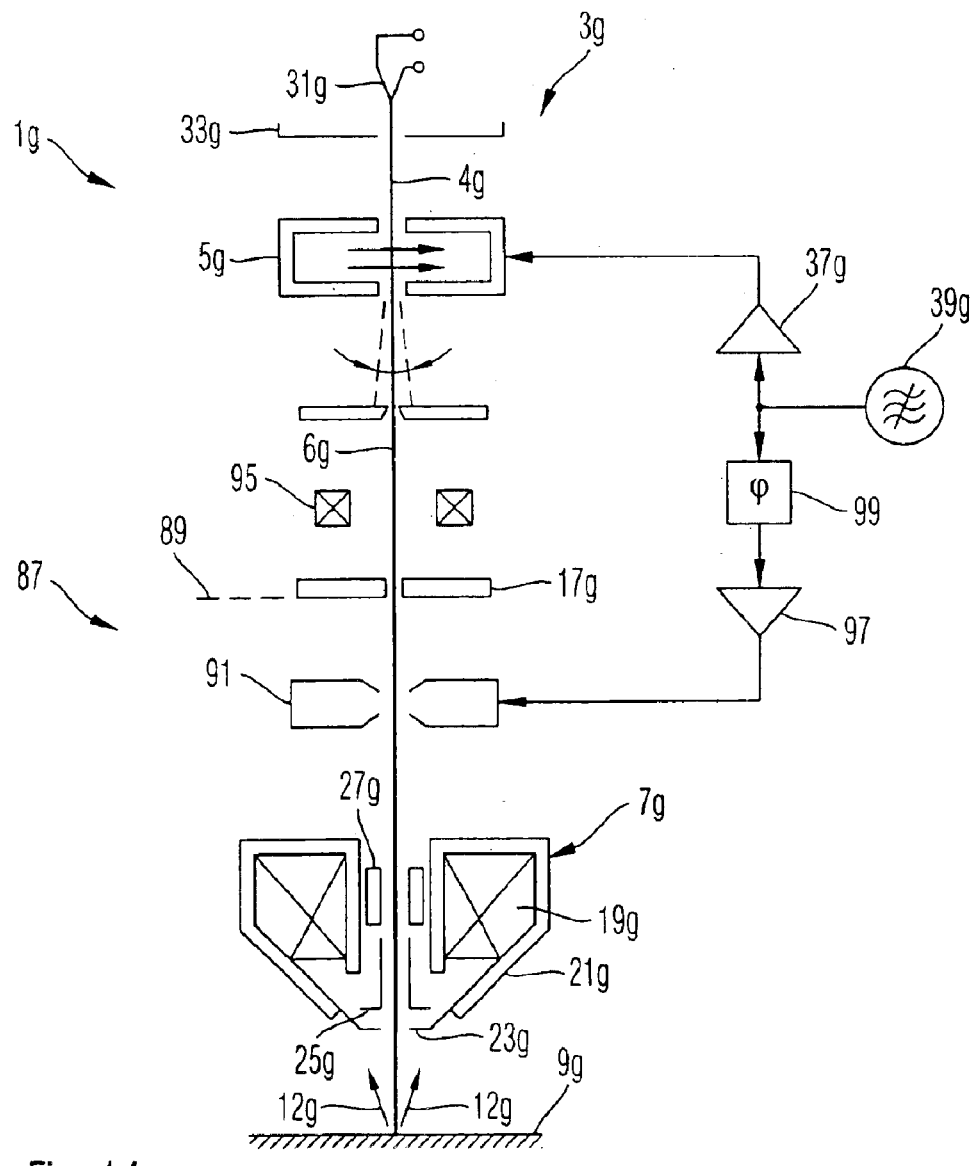
FIG. 14 is a schematic illustration of an electron microscopy system according to a sixth embodiment of the invention.

FIG. 14 schematically illustrates an electron microscopy system 1g using a focusing system of a type illustrated with reference to FIGS. 11 to 13 above. The electron microscopy system 1g comprises a pulsed electron beam source 3g and an objective lens 7g, similar to that shown in FIG. 1. A focusing system 87 comprises on the one hand the objective lens 7g and on the other hand a further focusing lens 95 for focusing the pulsed particle beam 6g approximately in a plane 89 on the optical axis. In the region of the plane 89 there is also arranged a disk shaped detector 17g for detecting secondary electrons. The detector 17g is traversed by primary electron beam 6g through a central aperture. A cavity resonator 91 for compensating aberrations of the objective lens 7g is arranged between the plane 89 and the objective lens 7g. The function of the cavity resonator 91 for compensation of the aberrations of the objective lens 7g is improved by providing a drift space L between the resonator 91 and the objective lens 7g. In such drift space L the electrons of the primary electron beam continue to move after traversing the cavity resonator 91, and in which they are substantially not subjected to influences of the cavity resonator 91 and the focusing action of the objective lens 7g. In particular, the drift space L has the function of reducing a duration of the primary electron pulses at the object plane 9g.

The cavity resonator 5g for generating the pulses of the particle beam and the cavity resonator 91 for compensating the aberrations of the objective lens 7g are supplied by a common high frequency source 39g but have separate high frequency amplifiers 37g and 97, respectively. A phase shifter 99 is provided for setting a phase relation between the pulsed source 3g and the cavity resonator 91 in such a way that the effect of the cavity resonator 91 with respect to the reduction of aberrations of the objective lens 7g is optimized as far as possible.

Of course it is also possible to use another pulsed source in place of the pulsed source operating with the cavity resonator such as for example the pulsed electron source illustrated with reference to FIG. 4 above.

The electron microscopy system illustrated with reference to FIG. 14 corresponds with respect to the detection of the secondary electrons using a disk shaped detector 17g to a conventional SEM. However, it is also possible to reduce aberrations of the objective lens by using the cavity resonator 91 in other microscopy systems, such as in the microscopy systems illustrated with reference to FIGS. 1, 5, 7, 8 or 9. The aberration-reducing cavity resonator may be inserted in the beam path of the primary electrons upstream of the objective lens. This resonator can then also be traversed by the secondary electrons.

It is also possible to insert the aberrations-reducing cavity resonator 91 in the embodiments according to the FIGS. 1, 5 or 7, between the electron source and beam splitter.

To summarize, an electron microscopy system and an electron microscopy method for detection of time dependencies of secondary electrons generated by primary electrons is provided, in which the primary electron pulses are directed onto a sample surface and electrons emanating from the sample surface are detected, time resolved. To this end the system comprises in particular a cavity resonator. A cavity resonator can also be used to reduce aberrations of focusing lenses.

While the invention has been described also with respect to certain specific embodiments thereof, it is evident that many alternatives, modifications and variations will be apparent to those skilled in the art. Accordingly, the preferred embodiments of the invention set forth herein are intended to be illustrative and not limiting in any way. Various changes may be made without departing from the spirit and scope of the present invention as given by the following claims and equivalents thereof.

What is claimed is:

1. An electron microscopy system, comprising:
   a pulsed electron beam source for generating a pulsed primary electron beam incident on a sample;
   an objective lens disposed in a beam path of secondary electrons emanating from the sample;
   an electron detector disposed in a beam path of the secondary electrons downstream of the objective lens;
   a first cavity resonator disposed in the beam path of the secondary electrons downstream of the objective lens and upstream of the electron detector; and
   a high frequency generator for supplying a high frequency power to the first cavity resonator;
   wherein the first cavity resonator and the high frequency generator are configured such that a main component of an electromagnetic field generated in the first cavity resonator is a magnetic field oriented transversely to a direction of the beam path of the secondary electrons traversing the first cavity resonator.

2. The electron microscopy system according to claim 1, further comprising a first beam stop having an aperture disposed downstream of the first cavity resonator in the beam path of the secondary electrons.

3. The electron microscopy system according to claim 2, further comprising a controller configured to change a phase of the high frequency power supplied by the high frequency generator relative to a pulse generation cycle of the pulsed electron beam source.

4. The electron microscopy system according to claim 1, wherein the electron detector is a position sensitive detector configured to detect electron intensities in dependence of a location in a plane oriented transversely with respect to the beam path of the secondary electrons.

5. The electron microscopy system according to claim 1, wherein the first cavity resonator and the high frequency generator are configured such that secondary electrons traversing the first cavity resonator are deflected in a first direction transversely oriented with respect to the beam path of the secondary electrons.

6. The electron microscopy system according to claim 5, wherein the position sensitive detector comprises a line detector having a plurality of electron sensitive regions disposed along a line.

7. The electron microscopy system according to claim 1, wherein the first cavity resonator and the high frequency generator are configured such that secondary electrons traversing the first cavity resonator are deflected in a first direction and a second direction, and wherein the first and second directions are transversely oriented with respect to each other and with respect to the beam path of the secondary electrons.

8. The electron microscopy system according to claim 7, wherein the position sensitive detector comprises an array of plural electron sensitive regions.

9. The electron microscopy system according to claim 1, wherein the energy selector comprises a beam splitter for separating the beam path of the secondary electrons from a beam path of the primary electron beam.

10. The electron microscopy system according to claim 1, further comprising an energy selector for separating beam paths of secondary electrons of different kinetic energies.

11. The electron microscopy system according to claim 10, wherein the energy selector comprises a beam splitter for separating the beam path of the secondary electrons from a beam path of the primary electron beam.

12. The electron microscopy system according to claim 10, wherein a separation direction of the energy filter with respect to the beam path of the secondary electrons is oriented transversely to a deflection direction of the first cavity resonator with respect to the beam path of the secondary electrons.

13. The electron microscopy system according to claim 1, wherein the objective lens is disposed in a beam path of the primary electron beam.

14. The electron microscopy system according to claim 13, wherein the objective lens comprises a beam deflector for scanning the primary electron beam across the sample.

15. The electron microscopy system according to claim 1, wherein the pulsed electron beam source comprises an electron source, a second cavity resonator and a second beam stop having an aperture, wherein the second cavity resonator is disposed between the electron source and the second beam stop.

16. The electron microscopy system according to claim 15, wherein the first cavity resonator is disposed in a beam path of the primary electron beam wherein a deflection direction of the first cavity resonator with respect to the primary electron beam is oriented transversely to a deflection direction of the second cavity resonator with respect to the primary electron beam.

17. The electron microscopy system according to claim 1, wherein the pulsed electron beam source comprises an electron source, the first cavity resonator and a second beam stop having an aperture, wherein the first cavity resonator is disposed between the electron source and the second beam stop in a beam path of the primary electron beam.

18. The electron microscopy system according to claim 1, wherein the pulsed electron beam source comprises an electron emitting body and a pulsed photon source configured for emitting a pulsed photon beam incident on the electron emitting body.

19. An electron microscopy system, comprising:
a pulsed electron beam source for generating a pulsed primary electron beam incident on a sample;
an objective lens disposed in a beam path of secondary electrons emanating from the sample;
an electron detector disposed in a beam path of the secondary electrons downstream of the objective lens;
a first beam deflector for deflecting secondary electrons traversing the first beam deflector, wherein the first beam deflector is disposed in the beam path of the secondary electrons downstream of the objective lens and upstream of the electron detector; and
a high frequency generator for supplying a high frequency power to the first beam deflector to periodically change a deflection angle of the first beam deflector.

20. The electron microscopy system according to claim 19, wherein the first beam deflector comprises a cavity resonator to which the high frequency power is supplied.

21. The electron microscopy system according to claim 19, further comprising a controller configured to change a phase of the high frequency power supplied by the high frequency generator relative to a pulse generation cycle of the pulsed electron beam source.

22. An electron microscopy system, comprising:
a pulsed electron beam source for generating a pulsed primary electron beam incident on a sample;
an objective lens disposed in a beam path of secondary electrons emanating from the sample;
a time resolving electron detection system disposed in the beam path of the secondary electrons downstream of the objective lens, the time resolving electron detection system having a time resolution of less than 100 pico seconds.

23. The electron microscopy system according to claim 22, wherein the time resolution is less than 50 ps.

24. A focusing system for charged particles, comprising:
a pulsed particle source for generating a pulsed beam of charged particles;
a focusing lens disposed in a beam path of the pulsed beam of charged particles;
a cavity resonator disposed in the beam path of the pulsed beam of charged particles upstream of the focusing lens; and
a high frequency generator supplying a high frequency power to the cavity resonator;
wherein the cavity resonator and the high frequency generator are configured such that a main component of an electromagnetic field generated in the cavity resonator is an oscillating electric field oriented in a direction of the beam path of the pulsed beam of charged particles traversing the cavity resonator, wherein an electric field strength of the oscillating electric field increases with an increasing distance from a center of the cavity resonator in a direction transverse to the beam path of the pulsed beam, and
wherein the pulsed particle source and the high frequency generator are synchronized such that, at a given time, one of the following conditions is fulfilled:
charged particles of the pulsed beam traversing the cavity resonator gain an amount of energy which increases with an increasing distance from the center at which they traverse the cavity resonator, and
the charged particles of the pulsed beam traversing the cavity resonator lose an amount of energy which decreases with an increasing distance from the center at which they traverse the cavity resonator.

25. The focusing system according to claim 24, wherein an excitation mode of the electromagnetic field in the cavity oscillator is substantially a $TM_{010}$ mode.

26. A focusing system for charged particles, comprising:
a pulsed particle source for generating a pulsed beam of charged particles;
a focusing lens disposed in a beam path of the pulsed beam of charged particles;
a cavity resonator disposed in the beam path of the pulsed beam of charged particles upstream of the focusing lens, wherein the cavity resonator and the focusing lens are disposed at a distance from each other to provide a drift region between the cavity resonator and the focusing lens; and
a high frequency generator supplying a high frequency power to the cavity resonator;
wherein the cavity resonator and the high frequency generator are configured such that a main component of an electromagnetic field generated in the cavity resonator is an oscillating electric field oriented in a direction of the beam path of the pulsed beam of charged particles traversing the cavity resonator, and wherein the pulsed particle source and the high frequency generator are synchronized such that charged particles of a bunch of particles of the pulsed beam traversing the cavity resonator and disposed in a rear portion of the bunch are accelerated as compared to charged particles disposed in a front portion of the bunch.

27. The focusing system according to claim 26, wherein an excitation mode of the electromagnetic held in the cavity oscillator is substantially a $TM_{010}$ mode.

28. The focusing system according to claim 26, wherein the pulsed particle source and the high frequency generator are synchronized such that the bunch of charged particles enters the cavity oscillator when a field strength of the oscillating electric field is an increasing field strength.

29. The focusing system according to claim 26, wherein an oscillation period of the high frequency power is more than four times a time difference between a time when a front of the bunch enters the cavity resonator and a time when a rear of the bunch enters the cavity resonator.

30. The focusing system according to claim 26, wherein an oscillation period of the high frequency power is more than eight times a time difference between a time when a front of the bunch enters the cavity resonator and a time when a rear of the bunch enters the cavity resonator.

31. An electron microscopy system, comprising:
a pulsed electron beam source for generating a pulsed primary electron beam;
an objective lens for focusing the primary electron beam onto a sample;
a cavity resonator disposed in the beam path of the primary electron beam upstream of the objective lens; and
a high frequency generator supplying a high frequency power to the cavity resonator;
wherein the cavity resonator and the high frequency generator are configured such that a main component of an electromagnetic field generated in the cavity resonator is an oscillating electric field oriented in a direction of the beam path of the primary electron beam traversing the cavity resonator, wherein an electric field strength of the oscillating electric field increases with an increasing distance from a center of the cavity resonator in a direction transverse to the beam path of the pulsed beam, and
wherein the pulsed electron beam source and the high frequency generator are synchronized such that, at a given time, one of the following conditions is fulfilled:
electrons of the primary electron beam traversing the cavity resonator gain an amount of energy which increases with an increasing distance from the center at which they traverse the cavity resonator, and
the electrons of the primary electron beam traversing the cavity resonator lose an amount of energy which decreases with an increasing distance from the center at which they traverse the cavity resonator.

32. The electron microscopy system according to claim 31, wherein an excitation mode of the electromagnetic field in the cavity oscillator is substantially a $TM_{010}$ mode.

33. An electron microscopy system, comprising:
a pulsed electron beam source for generating a pulsed primary electron beam;
an objective lens for focusing the primary electron beam onto a sample;
a cavity resonator disposed in the beam path of the primary electron beam upstream of the objective lens, wherein the cavity resonator and the objective lens are disposed at a distance from each other to provide a drift region between the cavity resonator and the objective lens; and
a high frequency generator supplying a high frequency power to the cavity resonator;
wherein the cavity resonator and the high frequency generator are configured such that a main component of an electromagnetic field generated in the cavity resonator is an oscillating electric field oriented in a direction of the beam path of the primary electron beam traversing the cavity resonator, wherein an electric field strength of the oscillating electric field increases with an increasing distance from a center of the cavity resonator in a direction transverse to the beam path of the pulsed beam, and
wherein the cavity resonator and the high frequency generator are configured such that a main component of an electromagnetic field generated in the cavity resonator is an oscillating electric field oriented in a direction of the beam path of the pulsed beam of charged particles traversing the cavity resonator, and
wherein the pulsed particle source and the high frequency generator are synchronized such that charged particles of a bunch of particles of the pulsed beam traversing the cavity resonator and disposed in a rear portion of the bunch are accelerated as compared to charged particles disposed a front portion of the bunch.

34. The electron microscopy system according to claim 33, wherein an excitation mode of the electromagnetic field in the cavity oscillator is substantially a $TM_{010}$ mode.

35. The electron microscopy system according to claim 33, wherein the pulsed particle source and the high frequency generator are synchronized such that the bunch of charged particles enters the cavity oscillator when a field strength of the oscillating electric field is an increasing field strength.

36. The electron microscopy system according to claim 33, wherein an oscillation period of the high frequency power is more than four times a time difference between a time when a front of the bunch enters the cavity resonator and a time when a rear of the bunch enters the cavity resonator.

37. The electron microscopy system according to claim 33, wherein an oscillation period of the high frequency power is more than eight times a time difference between a time when a front of the bunch enters the cavity resonator and a time when a rear of the bunch enters the cavity resonator.

38. The electron microscopy system according to claim 33, wherein the objective lens comprises a beam deflector for scanning the primary electron beam across the sample.

39. An electron microscopy method, comprising:
generating bunches of primary electrons;
accelerating a first group of primary electrons of each bunch of primary electrons relative to a second group of primary electrons of the bunch, using a cavity resonator supplied with a high frequency power;
focusing the bunches in which the first group of primary electrons has been accelerated relative to the second group of primary electrons onto a sample; and
detecting secondary electrons emanating from the sample.

40. The electron microscopy method according to claim 39, wherein electrons of the first group of primary electrons of the bunch are located radially outside of electrons of the second group of primary electrons of the bunch while the bunch is focused.

41. The electron microscopy method according to claim 39, wherein electrons of the first group of primary electrons of the bunch are located behind electrons of the second group of primary electrons of the bunch while the first group of primary electrons is accelerated relative to the second group.

42. An electron microscopy method, comprising:

generating bunches of primary electrons;

focusing the bunches of primary electrons onto a sample; and detecting a time structure of electron intensifies of bunches of secondary electrons emanating from the sample by;

allowing the secondary electrons emanating from the sample to traverse a cavity resonator;

supplying high frequency power to the cavity resonator for generating a deflecting electromagnetic field within the cavity resonator, and detecting at least a portion of the secondary electrons traversing the cavity resonator depending on a deflection of the secondary caused by the deflecting electromagnetic field.

* * * * *

UNITED STATES PATENT AND TRADEMARK OFFICE
CERTIFICATE OF CORRECTION

PATENT NO.    : 6,949,744 B2
DATED         : September 27, 2005
INVENTOR(S)   : Michael Steigerwald et al.

It is certified that error appears in the above-identified patent and that said Letters Patent is hereby corrected as shown below:

Column 12,
Line 41, "17$b_1$, 17$d_2$ and 17$d_3$, ..." should read -- 17$d_1$, 17$d_2$ and 17$d_3$, ... --;
Line 53, "..., the electron microscopy system id does not ..." should read -- ..., the electron microscopy system 1$d$ does not ... --;

Column 14,
Line 9, "An electron microscopy system if schematically shown in ..." should read -- An electron microscopy system 1$f$ schematically shown in ... --;

Column 16,
Line 23, "...time to is depicted." should read -- time $t_0$ is depicted. --;
Line 27, "At the time to the electrical field ..." should read -- At the time $t_0$ the electrical field ... --;

Column 24,
Line 1, "... detecting a time structure of electron intensifies of ..." should read -- ... detecting a time structure of electron intensities of ... --; and
Line 11, "... tion of the secondary caused by the deflecting electro-..." should read -- tion of the secondary electrons caused by the deflecting electro- ... --.

Signed and Sealed this

Twentieth Day of December, 2005

JON W. DUDAS
*Director of the United States Patent and Trademark Office*